(12) United States Patent
Kobrin et al.

(10) Patent No.: US 8,501,277 B2
(45) Date of Patent: Aug. 6, 2013

(54) DURABLE, HEAT-RESISTANT MULTI-LAYER COATINGS AND COATED ARTICLES

(75) Inventors: Boris Kobrin, Dublin, CA (US); Dangaria Nikunji Hirji, San Jose, CA (US); Romuald Nowak, Cupertino, CA (US); Michael T. Grimes, San Jose, CA (US)

(73) Assignee: Applied Microstructures, Inc., San Jose, CA (US)

(*) Notice: Subject to any disclaimer, the term of this patent is extended or adjusted under 35 U.S.C. 154(b) by 736 days.

(21) Appl. No.: 12/151,323

(22) Filed: May 5, 2008

(65) Prior Publication Data

US 2008/0299288 A1    Dec. 4, 2008

Related U.S. Application Data

(63) Continuation-in-part of application No. 11/528,093, filed on Sep. 26, 2006, now abandoned, which is a continuation of application No. 11/112,664, filed on Apr. 21, 2005, now Pat. No. 7,776,396, which is a continuation-in-part of application No. 10/996,520, filed on Nov. 23, 2004, now abandoned, which is a continuation-in-part of application No. 10/862,047, filed on Jun. 4, 2004, now Pat. No. 7,638,167.

(60) Provisional application No. 60/930,290, filed on May 14, 2007.

(51) Int. Cl.
*C23C 16/00* (2006.01)

(52) U.S. Cl.
USPC ............... 427/255.7; 427/248.1; 427/255.15; 427/255.18; 427/255.19

(58) Field of Classification Search
USPC .............. 427/248.1, 255.29, 255.31, 255.32, 427/419.3
See application file for complete search history.

(56) References Cited

U.S. PATENT DOCUMENTS

| | | | | |
|---|---|---|---|---|
| 5,254,411 | A | 10/1993 | Takeda et al. | 428/447 |
| 5,952,778 | A | 9/1999 | Haskal et al. | 313/504 |
| 6,030,671 | A * | 2/2000 | Yang et al. | 428/34 |
| 6,146,767 | A * | 11/2000 | Schwartz | 428/457 |
| 6,926,572 | B2 | 8/2005 | Park et al. | 445/24 |
| 6,963,125 | B2 | 11/2005 | Featherby et al. | 257/680 |
| 2003/0228484 | A1 * | 12/2003 | Finley et al. | 428/577 |
| 2004/0194691 | A1 | 10/2004 | George et al. | 117/84 |

(Continued)

OTHER PUBLICATIONS

International Search Report of corresponding PCT Application Serial No. PCT/US08/06098.

*Primary Examiner* — David Turocy
(74) *Attorney, Agent, or Firm* — Martine Penilla Group, LLP

(57) ABSTRACT

A method of providing a durable protective coating structure which comprises at least three layers, and which is stable at temperatures in excess of 400° C., where the method includes vapor depositing a first layer deposited on a substrate, wherein the first layer is a metal oxide adhesion layer selected from the group consisting of an oxide of a Group IIIA metal element, a Group IVB metal element, a Group VB metal element, and combinations thereof; vapor depositing a second layer upon said first layer, wherein said second layer includes a silicon-containing layer selected from the group consisting of silicon oxide, silicon nitride, and silicon oxynitride; and vapor depositing a third layer upon said second layer, wherein said third layer is a functional organic-comprising layer. Numerous articles useful in electronics, MEMS, nanoimprinting lithography, and biotechnology applications can be fabricated using the method.

24 Claims, 4 Drawing Sheets

U.S. PATENT DOCUMENTS

| | | | |
|---|---|---|---|
| 2005/0012975 A1* | 1/2005 | George et al. | 359/223 |
| 2005/0186515 A1 | 8/2005 | Watkins | 430/322 |
| 2005/0271809 A1 | 12/2005 | Kobrin et al. | 427/248.1 |
| 2005/0271900 A1* | 12/2005 | Kobrin et al. | 428/701 |
| 2006/0054262 A1 | 3/2006 | Kikuchi et al. | 156/60 |
| 2007/0020392 A1* | 1/2007 | Kobrin et al. | 427/249.1 |
| 2007/0031597 A1 | 2/2007 | Cho et al. | 427/248.1 |
| 2008/0081151 A1 | 4/2008 | Kobrin et al. | 428/141 |

* cited by examiner

DURABLE, HEAT-RESISTANT MULTI-LAYER COATINGS AND COATED ARTICLES

This application claims priority under 35 U.S.C. 120 as a continuation-in-part of U.S. application Ser. No. 11/528,093 (now abandoned), filed on Sep. 26, 2006 now abandoned, which claimed priority as a continuation of U.S. application Ser. No. 11/112,664 (now U.S. Pat. No. 7,776,396), filed on Apr. 21, 2005, which claimed priority as a continuation-in-part of U.S. application Ser. No. 10/996,520 (now abandoned), filed on Nov. 23, 2004 now abandoned, which claimed priority as a continuation-in-part of application Ser. No. 10/862,047 (now U.S. Pat. No. 7,638,167), filed on Jun. 4, 2004. The present application claims priority under 35 U.S.C. 119 to U.S. Provisional Application No. 60/930,290, titled: Durable Multi-layer Coatings and Coated Articles, which was filed on May 14, 2007. U.S. Provisional Application No. 60/930,290 is hereby incorporated by reference in its entirety. The present application is also related to the following applications, each of which is hereby incorporated by reference in its entirety: U.S. application Ser. No. 10/759,857 (now abandoned), filed Jan. 17, 2004, and titled "Apparatus and Method for Controlled Application of Reactive Vapors to Produce Thin Films and Coatings"; U.S. application Ser. No. 11/295,129 (now U.S. Pat. No. 7,695,775), filed Dec. 5, 2005, and titled "Controlled Vapor Deposition of Biocompatible Coatings Over Surface Treated Substrates"; U.S. application Ser. No. 10/912,656 (now abandoned), filed Aug. 4, 2004, and titled "Vapor Deposited Functional Organic Coatings"; U.S. application Ser. No. 11/123,487 (now abandoned), filed May 5, 2005, and titled "Controlled Vapor Deposition of Biocompatible Coatings for Medical Devices"; and U.S. patent application Ser. No. 11/447,186 (now U.S. Pat. No. 8,067,258), filed Jun. 5, 2006, and titled "Protective Thin Films For Use During Fabrication of Semiconductors, MEMS, and Microstructures."

BACKGROUND OF THE INVENTION

1. Field of the Invention

A durable, heat-resistant functional hydrophobic, hydrophilic, or reactive coating deposited using vapor deposition techniques on a variety of substrate materials.

2. Brief Description of the Background Art

This section describes background subject matter related to the invention, with the purpose of aiding one skilled in the art to better understand the disclosure of the invention. There is no intention, either express or implied, that the background art discussed in this section legally constitutes prior art.

Substrate materials, micro structures, and components coated with hydrophobic and hydrophilic films have, in recent years, found many applications in a variety of industries including automotive, semiconductors (SEMI), micro-electro-mechanical systems (MEMS), bio- and micro-fluidics, nano-imprint lithography (NIL), and others. The main motivation and purpose of such coatings is the desire to obtain a specific surface property and/or protection of the material surface without changing the base substrate material itself. For example, self-assembled monolayers (SAM) formed from hydrocarbon and fluorocarbon coatings provide hydrophobic surfaces characterized by a very low surface energy and low reactivity. Such films prevent wetting, improve de-wetting, and facilitate cleaning in the case of e.g. glass and automotive industry parts. SAM coatings are also used to prevent stiction in MEMS and NIL applications, and can enhance protection from moisture and environmental contamination in packaging of semiconductors and display devices. Conversely, hydrophilic films are used in applications where an improvement in surface wetting is desired, such as in the case of microfluidic devices, bio-chips, anti-fog and other related applications.

The liquid and vapor phase coating techniques known to provide such functional surfaces frequently include substrate surface silanization using silane based precursors. The most commonly used substrate surface reaction mechanisms for silane precursor attachment are hydrolysis of a chlorosilane and its reaction with hydroxyl groups present on the substrate surface. Another possibility is the attachment of an amine terminated alkylsilane to the substrate surface. Particularly, covalent reaction with the substrate surface, whether with hydroxyl groups or other groups which are strongly attached to the substrate surface, provides a strong bonding of the silane to the substrate surface. Covalent bonding provides a relatively high mechanical and chemical stability of the films. With respect to reaction with hydroxyl groups, this reaction requires a high concentration of the hydroxyl groups on the substrate surface, and is therefore limited to substrates exhibiting such groups, e.g. silicon, quartz, and various oxides.

Deposition of SAM functional coatings on substrate materials other than those exhibiting a high concentration of hydroxyl groups may be achieved using an adhesion layer-forming precursor. Many of these precursors form non-covalent bonds with the substrate material surface, and typically the overall coating structure including the adhesion layer with SAM attached exhibits a relatively inferior durability. This is particularly true when there is mechanical abrasion of the exterior, SAM-coated surface.

The use of specialized adhesion promoting layers, which adhere well to particular substrate materials and provide a high concentration of hydroxyl groups for subsequent reaction with a silane-based hydrophilic or hydrophobic coating precursor which is in vapor form (by way of example and not by way of limitation), has been proposed. Adhesion layers of silicon oxide or various metal oxides have been used because these exhibit a high density of surface hydroxyl states. Adhesion of a silicon oxide or metal oxide layer to the substrate material, as well as quality and durability of the top functional layer applied over the adhesion layer determine the ability of a SAM-coated surface to meet the demanding requirements in commercial applications. In commercial applications, the SAM-coated surface undergoes prolonged exposure to manufacturing and environmental factors such as: radiation, liquid immersion, mechanical friction, or high temperature.

In pending application Ser. No. 10/862,047 filed Jun. 4, 2004 (Pub. No. 2005/0271809) titled "Controlled Deposition of Silicon-Containing Coatings Adhered by an Oxide Layer", and in pending application Ser. No. 11/978,123 filed Oct. 26, 2007 (Pub. No. 2008-0081151A1) titled "Vapor Deposited Nanometer Functional Coating Adhered By An Oxide Layer", Kobrin et al. described methods of depositing functional SAM coatings using oxide films as adhesion layers on various substrates. The minimum thickness of the silicon dioxide adhesion layers grown by molecular vapor deposition (MVD) was said to be dependent on the substrate material used. Films as thick as 200 Å were required in the case of some substrate materials to assure relative stability of the adhesion layer upon water immersion. Metal oxides and in particular aluminum oxide and titanium oxide coatings were proposed as adhesion layers.

With regard to the use of metal oxide films in electronic device packaging, Featherby et al., in U.S. Pat. No. 6,963,125 issued Nov. 8, 2005, and entitled "Electronic Device Packaging" described an encapsulation method consisting of two layers: 1) an inorganic layer which prevents moisture intake and 2) an outside organic layer protecting the inorganic layer, in which both layers are said to be integrated with an electronic device plastic package. The organic layer which is applied directly over the inorganic layer is said to be preferably Parylene C (Col. 10), which is a relatively thick material, expensive, and is said to serve the function of protecting the brittle inorganic coating during manufacturing steps such as injection molding.

The use of dual layer films containing ALD alumina and a thin alkylaminosilane functional SAM coating attached to alumina was proposed for wear and stiction protection in MEMS by George et al. in U.S. application Ser. No. 10/910,525 filed Aug. 2, 2004 (Pub. No. US 2005/0012975), and entitled "Al2O3 Atomic Layer Deposition to Enhance the Deposition of Hydrophobic or Hydrophilic Coatings on Micro-electromechanical Devices". In addition, George et al., in U.S. application Ser. No. 10/482,627 filed on Jul. 16, 2002 (Pub. No. US 2004/0194691), and entitled "Method of Depositing an Inorganic Film on an Organic Polymer", described the use of an ALD metal oxide films as moisture and gas barriers on polymeric substrates.

With the development of electroluminescent devices, flat panel displays, organic light emitting diodes (OLEDs), and flexible electronics there is even a stronger need to protect such devices from performance degradation due to oxygen and moisture. PVD and ALD alumina films have been tried extensively for such applications, however, the single or dual layer protective coatings of the kind described above have been found to be inadequate.

Various multilayer film laminates, have been explored as a hermetic glass package replacement for use in OLEDs. For example, Haskal et al. in U.S. Pat. No. 5,952,778, issued Sep. 14, 1999, entitled "Encapsulated Organic Light Emitting Device" proposed an encapsulation scheme to prevent the OLED device from oxidation and degradation due to ambient oxygen and water. The protective encapsulation comprises three contiguous layers: a first layer of passivation metal such as gold, silver, indium, aluminum or transition metal; a second layer of thin film deposited dielectric material such as silicon dioxide or silicon nitride; and, a third layer of a hydrophobic polymer. Park et al. in U.S. Pat. No. 6,926,572, issued Aug. 9, 2005, entitled "Flat Panel Display Device and Method of Forming Passivation Film in the Flat Panel Display Device" proposed the use of an organic insulating film and/or a metal film in combination with an inorganic insulating film to provide a two layer or three layer passivating film. (Claim 14, for example) In particular, the reference teaches that it is possible to additionally form an organic insulating film before and/or after the inorganic insulating film is formed. (Col. 3, lines 47-50) Typically, the organic insulating film is said to be deposited by TCVDPF (thermal chemical vapor deposition polymer formation). When a metal film is part of the passivating film, it is proposed that the metal film is the first layer of a two or three layer passivation film, deposited over a cathode electrode which makes up part of the organic light emitting device. (Col. 4, lines 48-57)

Despite efforts like those described above, the functionality of the passivating coatings developed has been lacking, and the cost of the thick multilayer films proposed is high. The search for a better-performing and thinner protective films which meet cost and performance requirements continues, in an effort to commercialize a multitude of prototype devices in volume production.

SUMMARY

Described herein are film deposition methods and multi-layered structures which provide both an improved adhesion to substrates and an improved durability of an exterior functional organic layer such as a SAM layer. The method and the structures formed allow the multilayered film to be deposited on a multitude of substrates which exhibit a low density of hydroxyl groups. The method, and the multilayer films produced using the method are especially valuable in applications such as ink-jets, microfluidics, disk drives, nano-imprint lithography (NIL), packaging, and many others where conventional SAM deposition methods do not provide an exterior surface which meets durability requirements.

The multi-layered coating structures described subsequently herein, in the Detailed Description of Typical Embodiments, are designed so that the exterior layer of the structure provides durable hydrophilic and/or hydrophobic surface properties. The multi-layered coating structures comprise at least three layers, including a first adhesion layer which is typically a metal oxide; a second protective layer which includes a silicon-containing layer and typically a silicon-containing oxide; and a third exterior functional layer. The second protective layer may include more than one layer, which includes a silicon-containing layer and a metal oxide layer. The metal oxide adhesion layer is typically deposited using Atomic Layer Deposition (ALD) techniques, while the protective layer is deposited using a CVD technique, which is often a technique of the kind performed in an Molecular Vapor Deposition (MVD®) processing system. Molecular Vapor Deposition is a specialized form of chemical vapor deposition.

In embodiments of the invention which are described subsequently in the Detailed Description of Exemplary Embodiments, sequential layer depositions of either MVD® or ALD, or a combination of both may be used to produce various three-layer coatings. The individual coating layers are stacked in a manner to provide advantageous adhesion to an underlying substrate, an overlying layer which protects the adhesion layer, and an exterior functional organic layer. The exterior functional organic layer frequently is a self-assembled-monolayer (SAM). The combination of the adhesion layer, overlying protective layer, and exterior functional organic layer provides unexpected functionality in which the multi-layered coating structure can withstand higher temperatures than previously contemplated for an organic SAM, increased mechanical stress with reduced wear, and immersion in liquids.

The adhesion layer which is applied directly over the substrate to be coated is an oxide of a Group IIIA, or Group IVB, or Group VB metal element; the protective layer overlying the metal oxide is a silicon-containing layer selected from the group consisting of silicon oxide, silicon nitride, or silicon oxynitride; and, the exterior functional layer overlying the protective layer is formed from a functional organic compound. Frequently the functional organic compound forms a self assembled monolayer (SAM). The adhesion layer is often applied using an ALD technique, while the protective layer is often applied using a chemical vapor deposition technique, which is frequently the MVD® chemical vapor deposition technique, which has recently been described in the published art. The exterior functional layer is also deposited using a chemical vapor deposition technique, which is often the MVD® technique. The adhesion layer is typically deposited using precursors which include an organometallic compound. The protective layer is typically deposited using precursors which include a silane, and some of the most advantageous embodiment protective layers are deposited from organic silanes. The exterior functional layer is typically deposited from a precursor functionalized alkylchloro silane or a functionalized alkylamino silane. The individual coating layers are stacked in a way to provide an excellent adhesion to the substrate, to provide mechanically strength, and to provide a durable functional coating surface. The durable functional coating surface is typically organic in nature, yet able to withstand high temperature, in excess of 400° C., mechanical stress, and immersion in liquids.

DETAILED DESCRIPTION OF ILLUSTRATIVE EMBODIMENTS

Figure 1:
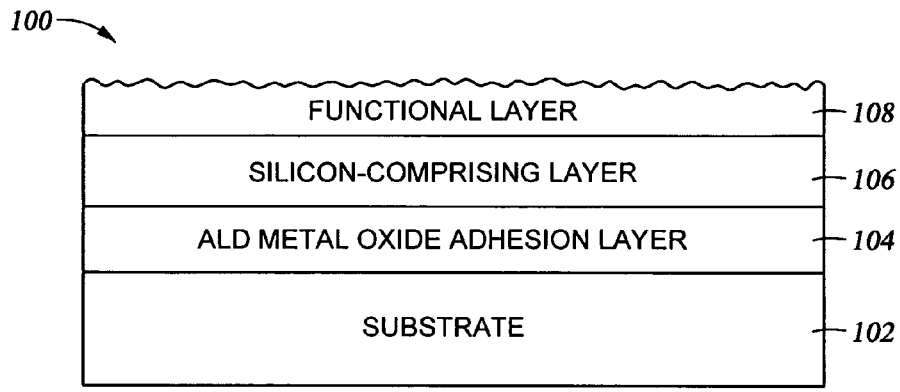
FIG. 1 shows a diagram 100 of a substrate 102 with an overlying three-layer coating which includes a metal oxide adhesion layer 104, a silicon comprising layer 106 which protects adhesion layer 104, and an exterior functional layer 108.

As a preface to the detailed description, it should be noted that, as used in this specification and the appended claims, the singular forms "a", "an", and "the" include plural referents, unless the context clearly dictates otherwise.

When the word "about" is used herein, this is intended to mean that the nominal value presented is precise within ±10%.

The exemplary embodiments of the invention described below are to illustrate the heat-resistant multilayered coatings of the invention. The described embodiments are not to limit the scope of the invention, as one skilled in the art will be able to use the description to extend the invention to the use of other, similar materials. The method of forming each layer of the multi-layered coating requires a particular sequence of deposition steps to produce the unique coatings; however, the methods of depositing individual layers of the coatings are known in the art in general.

The multi-layered coating structures comprise at least three layers of different composition, but may comprise additional layers. The three required layers are a first adhesion layer which is used to attach the coating structure to an underlying substrate; a second, silicon-comprising layer which adds to the mechanical, chemical, and thermal stability of the coating structure, and provides excellent adhesion to organic-based surfaces; and, a third exterior layer which provides surface functionality for the coating. The second silicon-comprising layer may be replaced by more than one layer, provided at least one of the replacement layers is a silicon-comprising layer. Frequently, the third exterior layer is a self-assembled monolayer (SAM) The presence of the silicon-comprising layer improves the durability of an exterior functional SAM layer.

The method and the structures formed allow the multilayered film to be deposited on a multitude of substrates which exhibit a low density of hydroxyl groups, such as particular metals, plastics and composites. The multi-layered coating structures are designed so that the exterior layer of the structure provides durable hydrophilic and/or hydrophobic surface properties. The exemplary embodiments described below are designed to provide hydrophobic surface properties, because coatings which provide a hydrophobic surface exhibiting wear-resistance and high temperature stability are particularly difficult to produce. One skilled in the art will recognize that hydrophilic multi-layered coatings in accordance with the present invention can be produced by using a SAM which provides hydrophilic functional properties on its presented exterior surface. The multi-layered coating structures with hydrophobic surface properties are in high demand for use in MEMS, nanoimprint lithography (NIL), microfluidics, and semiconductor packaging, for example and not by way of limitation.

As previously discussed, the methods which are used for vapor deposition of the coating structures may be Molecular Vapor Deposition (MVD®), which is a specialized form of chemical vapor deposition currently known in the art, or may be Atomic Layer Deposition (ALD), another form of chemical vapor deposition which is currently known in the art, or may be a combination of these two vapor deposition techniques. In embodiments of the invention which are described, sequential layer depositions of either MVD® or ALD, or a combination of both may be used to produce various multi-layered coatings. The individual coating layers are stacked in a manner to provide advantageous adhesion to an underlying substrate, an overlying layer which protects the adhesion layer and/or provides mechanical strength to the overall coating structure, and an exterior functional organic layer. The combination of the adhesion layer, overlying protective layer, and exterior functional organic layer is tailored to the substrate and can provide unexpected functionality in which the multi-layered coating structure can withstand higher temperatures than previously contemplated for an organic SAM, can withstand increased mechanical stress with reduced wear, and can withstand immersion in liquids for extended periods of time.

The adhesion layer which is applied directly over the substrate to be coated is an oxide of a Group IIIA, or Group IVB, or Group VB metal element; the protective layer overlying the metal oxide is either a silicon-containing layer selected from the group consisting of silicon oxide, silicon nitride, or silicon oxynitride, or may be more than one layer, provided at least one silicon-containing layer is included; and, the exterior functional layer overlying the protective layer is formed from a functional organic compound. Frequently the functional organic compound forms a SAM. The adhesion layer is often applied using an ALD technique, while the protective layer is often applied using a chemical vapor deposition technique, which is frequently the MVD® chemical vapor deposition technique. The exterior functional layer may also be deposited using a chemical vapor deposition technique, which is often the MVD® technique. The adhesion layer is typically deposited using precursors which include an organometallic compound. The protective layer is typically deposited using precursors which include either an inorganic silane or an organic silane. The exterior functional layer is typically deposited from a precursor functionalized alkylchloro silane or a functionalized alkylamino silane.

EXAMPLES OF ILLUSTRATIVE EMBODIMENTS

The coating layers described were vapor deposited from liquid precursors obtained from Gelest Inc. and Sigma. The coating layers were vapor deposited using the MVD® 100 vapor deposition system manufactured by Applied Microstructures, Inc. Surface cleaning and hydroxylation of substrate surfaces (when beneficial) were performed in-situ in the MVD® 100 vapor deposition system using a remotely-generated oxygen plasma source. The metal oxide adhesion layers; the silicon-containing layer which protects the adhesion layer and/or provides excellent adhesion to exterior organic-based surfaces; and, the exterior functional organic layer were grown sequentially at temperatures between about 50° C. and about 80° C., without exposure of the substrate to ambient conditions during the deposition processes. DI Water Contact Angles were determined using a Rame-Hart Goniometer.

Although one skilled in the art can appreciate that various different chemical reactions and precursor chemistries can be used for deposition of individual films in the multi-layer film stack, during deposition of the coating layers of the examples described below, the deposition method and precursor chemistry shown in Table One, below, were used.

TABLE ONE

| Coating Layer Type | Deposition Method | Precursor Chemistry |
|---|---|---|
| Metal Oxide | ALD | MO 1: TMA, $H_2O$ |
| | | MO 2: $TiCl_4$, $H_2O$ |
| Silicon-Comprising Layer | MVD ® | SO 1: BTCSE, $H_2O$ |
| | | SO 2: $SiCl_4$, $H_2O$ |
| Functional Exterior Organic Layer | MVD ® | F 1: FDTS, $H_2O$ |
| | | F 2: PF6 |

Legend for chemicals in Table One: Trimethylaluminum (TMA); Titanium tetrachloride ($TiCl_4$); Bis(trichlorosilyl)ethane (BTCSE); Silicon tetrachloride ($SiCl_4$); (Heptadecafluoro-1,1,2,2, tetrahydrodecyl) trichlorosilane (FDTS); Nonafluoro-1,1,2,2-tetrahydrohexyl tris(dimethylamino)silane (PF6); and water vapor ($H_2O$).

ALD Process Example—formation of metal oxide adhesion layers. An ALD method was used to deposit aluminum oxide or titanium oxide as the base adhesion layer. While other methods of CVD deposition of the metal oxide adhesion layer may be used, we have found that use of ALD provides excellent adhesion to an underling substrate in general. The ALD reaction consisted of alternating exposures of the substrate to reactants A (first reactant charged to the process chamber) and B (second reactant charged to the process chamber) in a number of repetitive AB cycles with a nitrogen gas purge and pump steps in between the reactant exposures to remove the residual non-adsorbed, non-reacted chemicals. In one ALD cycle the reactants were introduced sequentially, adsorbed on the surface, and purged. Typically 1.0-1.3 Å of aluminum oxide film is deposited in one cycle. The reaction cycle was then repeated a number of times to achieve ALD film thickness of 20 Å-100 Å, typically 50 Å-100 Å. The chemical precursors listed in Table One were used to form adhesion layers in an MVD® 100 Vapor Deposition System available from Applied Microstructures, Inc., San Jose, Calif. with the following processing parameters: The TMA or $TiCl_4$ which was applied to the substrate during the first step of a deposition cycle was applied at a partial pressure which was in the range of 0.2-5 Torr. The water vapor which was applied to the substrate during the second step of a deposition cycle was applied at a partial pressure ranging about 0.5-20 Torr. The reaction temperature in each step of the deposition cycle was in the range of 20-150° C. (typically 40-70° C.). The number of sequential cycle repetitions ranged 20-100, with nitrogen purge/pump in-between injections. An oxygen plasma step using a remote plasma source was used to pre-clean the substrates prior to film deposition.

MVD® Oxide Process Example—formation of silicon oxide inter-layer. Hydrophilic silicon oxide inter-layer films were deposited by the molecular vapor deposition (MVD®) method described previously herein, with reference to pending U.S. patent applications. The MVD® Vapor Deposition System was used and the reaction parameters were as follows. The BTCSE or $SiCl_4$ which was applied to the substrate during the first step of a deposition cycle was applied at a partial pressure which was in the range of 1-6 Torr. The water vapor which was applied during the second step of a deposition cycle was applied at a partial pressure ranging about 50 Torr to about 100 Torr. The reaction temperature in each step was in the range of about 25° C. to about 80° C. (typically about 40° C. to about 70° C.). The duration of the film growth reaction was about 5 min. to about 15 min., typically resulting in the formation of a film thickness ranging from about 50 Å to about 100 Å. However, thinner films down to about 20 Å, or thicker films up to about 200 Å may be deposited for particular applications.

MVD® SAM Process Example—deposition of fluorocarbon self-assembled mono-layer. Hydrophobic fluorocarbon SAM coatings were deposited by the molecular vapor deposition (MVD®) method described previously herein with reference to pending patent applications. The MVD® Vapor Deposition System was used and the reaction parameters were as follows. The FDTS or PF6 partial pressures were in the range of about 0.1 Torr to about 0.8 Torr and the water vapor partial pressure was in the range of about 2 Torr to about 5 Torr. The reaction chamber temperature was within the range of about 20° C. to about 100° C., (typically about 40° C. to about 70° C.). The reaction time ranged from about 5 min to about 30 min.

A Three-Layer film stack 100 is illustrated in FIG. 1, which shows a substrate 102 with an overlying three-layer coating which includes a first adhesion layer 104 which is a metal oxide layer (typically deposited using ALD, not by way of limitation); a silicon-comprising layer 106 which protects adhesion layer 104 and/or adds mechanical stability to the three-layer structure (which may be silicon oxide, silicon nitride, or silicon oxynitride) and improves adhesion to a SAM; and an exterior functional layer 108 (which is frequently a SAM). As discussed previously, it is contemplated that the silicon-comprising layer 106 may be replaced by multiple layers, where one of the multiple layers is a silicon-containing layer. For example, and not by way of limitation, the silicon-comprising layer 106 might include a silicon oxide layer generated from an organic silane precursor and a metal oxide layer generated from an organic metal oxide precursor.

The functional layer 108 may be formed from a precursor selected from the group consisting of (heptadecafluoro-1,1,2,2,-tetrahydrodecyl)trichlorosilane (FDTS), (tridecafluoro-1,1,2,2,-tetrahydrooctyl)tricholorsilane (FOTS), undecenyl-trichlorosilanes (UTS), vinyl-trichlorosilanes (VTS), decyltrichlorosilanes (DTS), octadecyltrichlorosilane (OTS), dimethyldichlorosilanes (DDMS), dodecenyltricholrosilanes (DDTS), and aminopropylmethoxysilanes (APTMS), by way of example and not by way of limitation. The OTS, DTS, UTS, VTS, DDTS, FOTS, and FDTS are all trichlorosilane precursors. The other end of the precursor chain is a saturated hydrocarbon with respect to OTS, DTS, and UTS; contains a vinyl functional group, with respect to VTS and DDTS; and contains fluorine atoms with respect to FDTS and FOTS (which also has fluorine atoms along the majority of the chain length). Other useful precursors include 3-aminopropyltri-methoxysilane (APTMS), which provides amino functionality, and 3-glycidoxypropyltrimethoxysilane (GPTMS), which provides epoxide functionality. One skilled in the art of organic chemistry can see that the vapor deposited coatings from these precursors can be tailored to provide particular functional characteristics for a coated surface.

Most of the silane-based precursors, such as commonly used di- and tri-chlorosilanes, for example and not by way of limitation, tend to create agglomerates on the surface of the substrate during the coating formation. These agglomerates can cause structure malfunctioning or stiction. Such agglomerations are produced by partial hydrolysis and polycondensation of the polychlorosilanes. This agglomeration can be prevented by precise metering of moisture in the process ambient which is a source of the hydrolysis, and by carefully controlled metering of the availability of the chlorosilane precursors to the coating formation process. The carefully metered amounts of material and careful temperature control of the substrate and the process chamber walls can provide the partial vapor pressure and condensation surfaces necessary to control formation of the coating on the surface of the substrate rather than promoting undesired reactions in the vapor phase or on the process chamber walls.

The schematic drawing of a three-layer film stack of the kind shown in FIG. 1 illustrates a typical example of a three-layer coating which may be deposited in-situ in a single processing chamber. An ALD metal oxide adhesion layer is the first layer, and serves the function of improving adhesion of subsequently applied layers to the substrate. The substrate is often a polymer or a metal substrate, as these substrates are more difficult to bond to. In addition to providing adhesion, this metal oxide layer can perform a protective function as moisture or gas barrier layer.

A Silicon oxide inter-layer, which may be silicon oxide, silicon nitride, or silicon oxynitride adheres well to the metal oxide and enhances bonding and durability of the top functional SAM coating. Silicon oxide deposited using the (MVD®) deposition method is preferred because this inter layer provides a clean non-contaminated (grown in-situ) oxide surface highly populated with hydroxyl groups. Finally, a hydrophobic, hydrophilic, or other functional layer is deposited on top of the silicon oxide layer, using an organic-based precursor to provide the desired functionality of the exterior surface.

Figure 2:
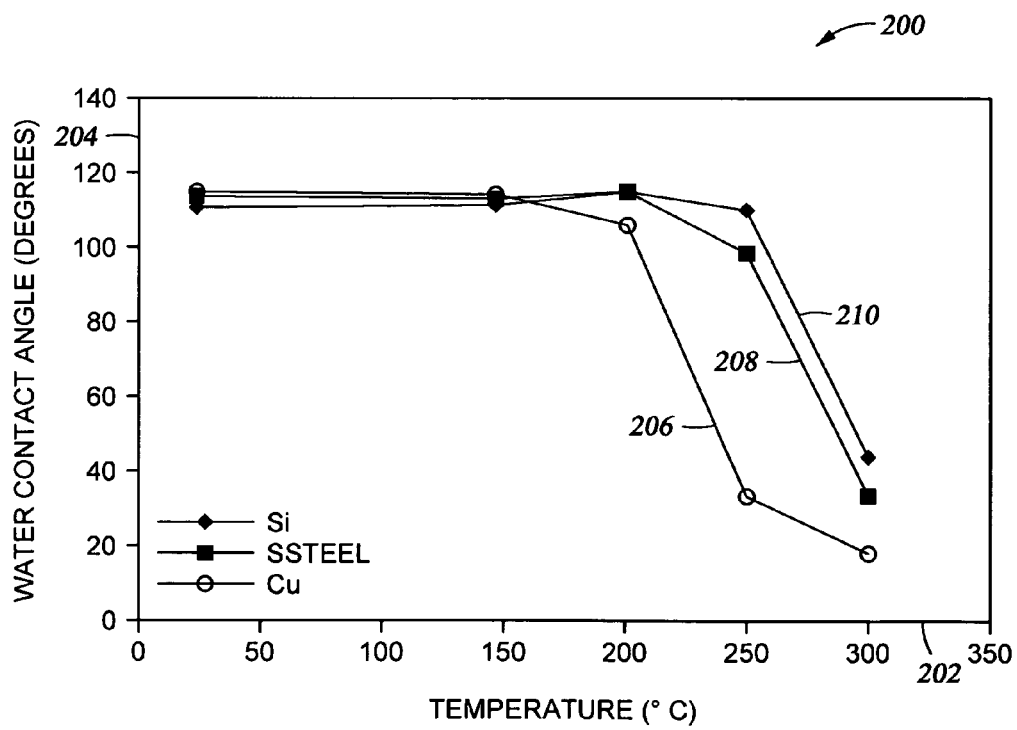
FIG. 2 shows a graph 200 illustrating the DI Water Contact Angle on scale 204, as a function of the substrate Temperature at which a hydrophobic coating of a kind known in the prior art was heat treated, on scale 202. This is a comparative example of the performance of a two layer coating, where the first layer deposited on the substrate is an ALD-deposited aluminum oxide, and the second, exterior layer is a SAM formed using a (Heptadecafluoro-1,1,2,2, tetrahydrodecyl) trichlorosilane (FDTS) precursor in combination with water. Curve 206 illustrates coating performance of the coating on a copper substrate. Curve 208 illustrates coating performance on a stainless steel substrate. Curve 210 illustrates coating performance on a silicon substrate.

FIG. 2 shows a graph 200 illustrating the DI Water Contact Angle on scale 204, as a function of the substrate Temperature at which a hydrophobic coating of a kind known in the prior art was heat treated, on scale 202 for a comparative example two layer coating, where the first layer deposited on the substrate is an ALD-deposited aluminum oxide (50 Å), and the second, exterior layer is a SAM formed using an FDTS precursor in combination with water. Curve 206 illustrates coating performance of the coating on a copper substrate. Curve 208 illustrates coating performance on a stainless steel substrate. Curve 210 illustrates coating performance on a silicon substrate. The DI Water Contact Angle degradation of the hydrophobic exterior layer produced from a FDTS precursor as the substrate temperature is increased is catastrophic after about 200° C. for the coating on a copper substrate (illustrated by Curve 206), and after about 260° C. for the coating on a stainless steel substrate (illustrated by Curve 208) or a silicon substrate (illustrated by Curve 210). Once the DI Water Contact Angle falls below about 100 degrees, the coating is no longer considered to provide a functioning hydrophobic surface.

Figure 3:
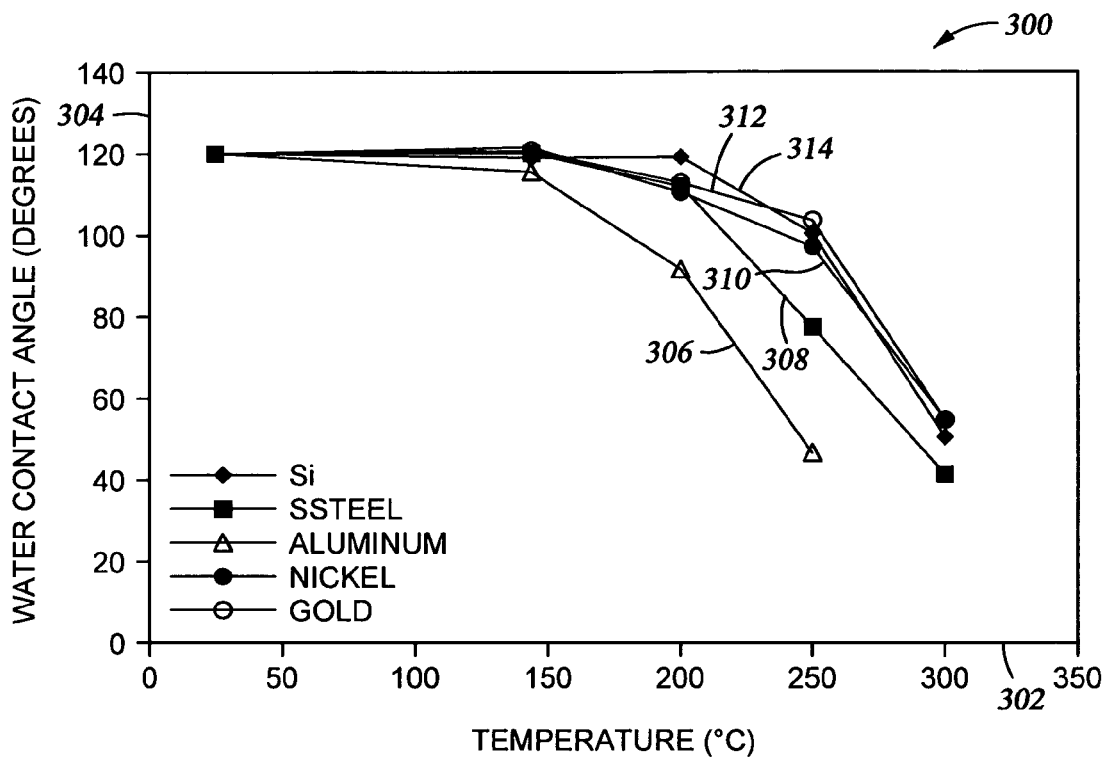
FIG. 3 shows a graph 300 illustrating the DI Water Contact Angle on scale 304, as a function of the substrate Temperature, at which another hydrophobic coating of a kind known in the prior art was heat treated, on scale 302. This is a comparative example of the performance of a two layer coating, where the first layer deposited on the substrate is an ALD-deposited titanium oxide, and the second, exterior layer is a SAM formed using a FDTS precursor in combination with water. Curve 306 illustrates coating performance of the coating on an aluminum substrate. Curve 308 illustrates coating performance on a stainless steel substrate. Curve 310 illustrates coating performance on a nickel substrate. Curve 312 illustrates coating performance on a gold substrate. And, Curve 314 illustrates coating performance on a silicon substrate.

FIG. 3 shows a graph 300 illustrating the DI Water Contact Angle on scale 304, as a function of the substrate Temperature, at which another hydrophobic coating of a kind known in the prior art was heat treated, on scale 302. This is a comparative example of the performance of a two layer coating, where the first layer deposited on the substrate is an ALD-deposited titanium oxide (50 Å), and the second, exterior layer is a SAM formed using a Perfluorodecyltrichlorosilane (FDTS) precursor in combination with water. Curve 306 illustrates coating performance of the coating on an aluminum substrate, where the hydrophobicity has failed (fallen below the 100 degree requirement) at a temperature of about 175° C. Curve 308 illustrates coating performance on a stainless steel substrate, where the hydrophobicity has failed at a temperature of about 250° C. Curve 310 illustrates coating performance on a nickel substrate, where the failure has occurred at a temperature of about 275° C. Curve 312 illustrates coating performance on a gold substrate, where the failure has occurred at a temperature of about 275° C. And, Curve 314 illustrates coating performance on a silicon substrate, where the hydrophobicity has failed at a temperature of about 275° C.

Figure 4:
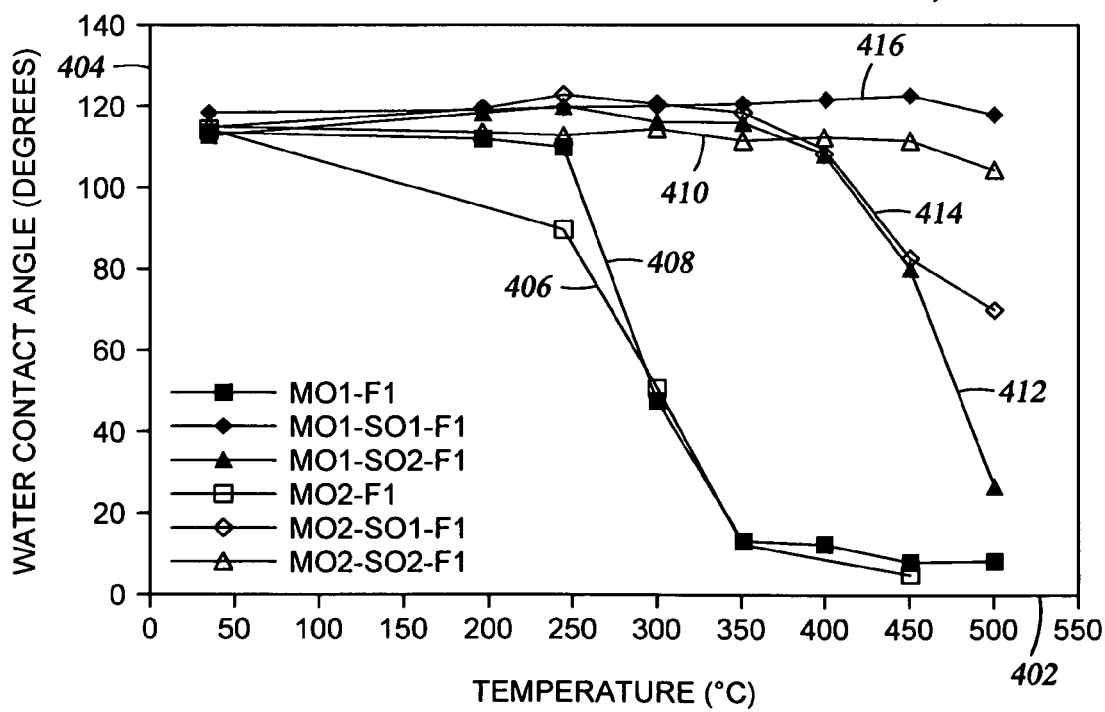
FIG. 4 shows a graph 400 illustrating the DI Water Contact Angle on scale 404, as a function of the substrate Temperature on Scale 402, for a variety of hydrophobic coatings. The underlying substrate on which the coatings were deposited was a silicon wafer substrate. This graph 400 illustrates both two layer coatings of the kind which were previously used, and coatings which are embodiments of the present invention, for purposes of comparison. Due to the number of substrates and different types of coatings which were tested, the description of the coatings and substrates is provided only in the Detailed Description Of Typical Embodiments, which is presented subsequently herein.

FIG. 4 shows a graph 400 illustrating the DI Water Contact Angle on scale 404, as a function of the substrate Temperature on Scale 402, for a variety of hydrophobic coatings, some of which are two-layer coatings of the kind described above, and some of which are the multi-layered (three-layered) coatings of present invention embodiments. The underlying substrate on which the coatings were deposited was a silicon wafer substrate. This graph 400, which illustrates both two layer coatings of the kind which were previously used, and coatings which are embodiments of the present invention, shows the significant improvement provided by the present invention.

Curve 406 represents an ALD titanium oxide (80 Å)/MVD® FDTS two-layer coating, where the DI Water Contact Angle fell below 100 degrees at about 160° C. Curve 408 represents an ALD aluminum oxide (50 Å)/MVD® FDTS two layer coating, where the DI Water Contact Angle fell below 100 degrees at about 270° C. Curve 410 represents an ALD titanium oxide (87 Å)/MVD® $SiCl_4$-generated silicon-oxide (93 Å)/MVD® FTDS three-layer coating, where the DI Water Contact Angle did not fall below 100 degrees until some point after 500° C. Curve 412 represents an ALD aluminum oxide (94 Å)/MVD® $SiCl_4$-generated silicon-oxide (148 Å)/MVD® FTDS three-layer coating, where the DI Water Contact Angle did not fall below 100 degrees until about 420° C. Curve 414 represents an ALD titanium oxide (85 Å)/MVD® BTCSE-generated silicon-oxide (105 Å)/MVD® FTDS three-layer coating, where the DI Water Contact Angle did not fall below 100 degrees until about 425° C. And, Curve 416 represents an ALD aluminum oxide (100 Å)/MVD® BTCSE-generated silicon-oxide (105 Å)/MVD® FTDS three-layer coating, where the DI Water Contact Angle did not fall below 100 degrees until some point after 500° C.

For many applications including semiconductor, micro device, or nanoimprint lithography applications, which require downstream processing at temperatures or thermal budgets over 250° C., dual layer films utilizing a metal oxide adhesion layer with an overlying SAM are not sufficiently durable. The result is illustrated in FIGS. 2, 3, and 4, which show comparative examples of failures of hydrophobicity of dual layer films at temperatures above 200° C. on multiple substrates. This result is quite surprising, as it is generally known that organic fluorocarbon films deposited directly upon a silicon substrate fail at about 400° C., depending on the film chemistry.

We have discovered that the performance of fluorocarbon-comprising hydrophobic exterior films on metal oxide substrates can be greatly improved and their stability can be extended to temperatures as high as 450° C. by using a silicon-containing layer such as a silicon oxide interlayer over a metal oxide adhesion layer, prior to deposition of the exterior functional film layer (see FIG. 4). Presence of a silicon oxide intermediate layer over a metal oxide adhesion layer on a substrate, with the fluorocarbon-comprising hydrophobic exterior films attached to the silicon oxide intermediate layer appears to provide a strong covalent bonding and effective cross-linking of the FDTS head groups to the silicon oxide intermediate layer, while the metal oxide adhesion layer provides a strong bonding to the substrate.

FIG. 4 shows that there is an improvement of DI Water Contact Angle and high temperature stability of a hydrophobic (perfluoro)alkyl chlorosilane-generated SAM coating on both aluminum oxide and titanium oxide adhesion layers when a silicon-containing intermediate layer is used between the SAM and the metal oxide. Further, the organic-based BTCSE-generated intermediate layer provides better temperature stability when used in combination with an aluminum oxide adhesion layer, while the inorganic-based $SiCl_4$-generated intermediate layer appears to provide better temperature stability when used in combination with a titanium oxide adhesion layer.

Similar significant improvement of three-layer coating stability in comparison to the respective two-layer coatings was confirmed when the PF6 (Nonafluoro-1,1,2,2-tetrahydrohexyl tris(dimethylamino) silane) precursor was used as the exterior SAM layer of the coating. Use of the silicon-containing intermediate layer improved the temperature durability of the hydrophobic top functional layer by about 100° C. or more over the published literature data for alkylamino silanes deposited over alumina films.

Figure 5:
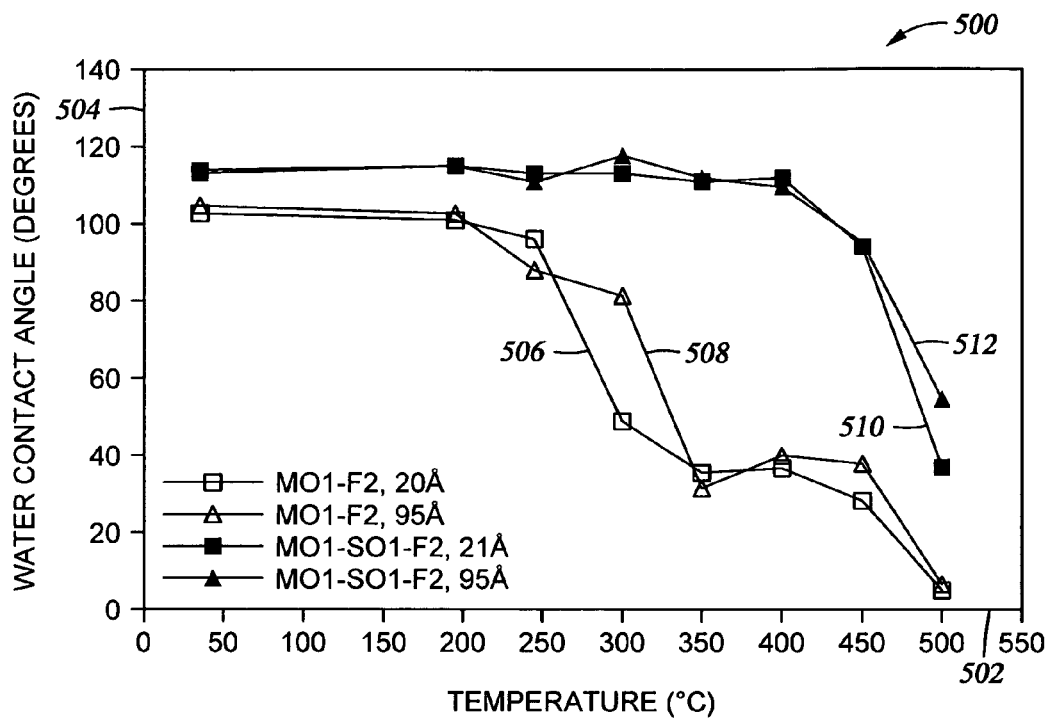
FIG. 5 shows a graph 500 illustrating the DI Water Contact Angle on scale 504, as a function of the substrate Temperature on Scale 502. Graph 500 shows Curves 506 and 508 for a two-layer AlOx/(Nonafluoro-1,1,2,2,-tetrahexyl) tris (dimethylamino)silane (PF6) coating deposited at two different thicknesses on a silicon wafer substrate. The Curves 506 and 508 are shown for comparison purposes against Curves 510 and 512, which show AlOx/BTCSE Ox/PF6 deposited at two different thicknesses on a silicon wafer substrate. This graph 500 illustrates both coatings of the kind previously used and coatings which are embodiments of the present invention, for purposes of comparison.

FIG. 5 shows a graph 500 illustrating the DI Water Contact Angle on scale 504, as a function of the substrate Temperature on Scale 502. Graph 500 shows Curves 506 and 508 for a two-layer AlOx/PF6 (Nonafluoro-1,1,2,2-tetrahydrohexyl tris(dimethylamino)silane) coating. Curve 506 represents the two-layer coating when the $AlO_x$ layer is 20 Å thick, while Curve 508 represents the two-layer coating when the $AlO_x$ layer is 95 Å thick.

Although the thicker AlOx layer does appear to improve the stability of the two-layer coating somewhat over the 250° C. and 350° C. temperature range, both of these coatings have dropped to a DI Water Contact Angle below 100 at about 210° C., and show a roughly equivalent DI Water Contact Angle below about 40 degrees between 350° C. and 500° C. Curves 510 and 512, each show a three-layer AlOx/BTCSE Ox/PF6 coating. Curve 510 represents the three-layer coating when the $AlO_x$ layer is 21 Å thick, while Curve 512 represents the three-layer coating when the $AlO_x$ layer is 95 Å thick. The BTCSE-generated oxide thickness was 115 Å for the three-layer coatings illustrated in Curves 510 and 512. The three-layer coatings maintain a DI Water Contact Angle of 100 or greater up to a temperature of about 440° C.

Figure 8:
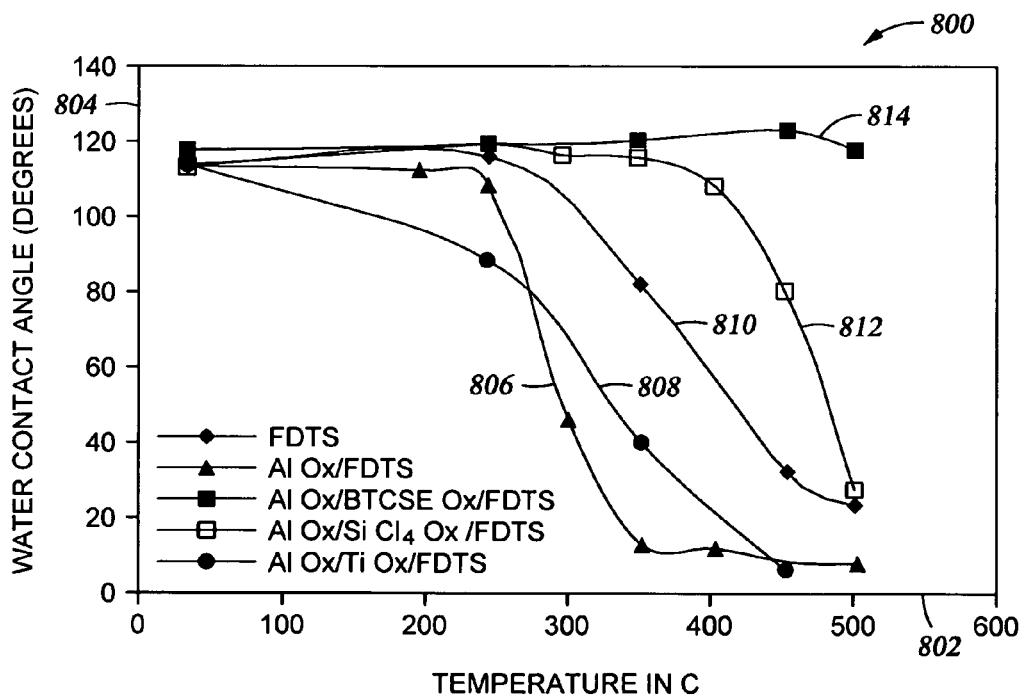
FIG. 8 shows a graph 800 illustrating the DI Water Contact Angle on scale 804, as a function of the substrate Temperature on scale 802. Graph 800 shows Curve 810 for a FDTS coating directly on a silicon wafer substrate; Curve 806 for a two-layer AlO$_x$/FDTS on the silicon wafer substrate; Curve 808 for a three-layer coating of AlO$_x$/TiO$_x$/FDTS on the silicon wafer substrate; Curve 812 for a three-layer coating of AlO$_x$/SiCl$_4$-generated SiO$_x$/FDTS; and, Curve 814 for a three-layer coating of AlO$_x$/BTCSE-generated SiO$_x$/FDTS. This graph 800 illustrates both coatings of the kind previously used and coatings which are embodiments of the present invention, for purposes of comparison.

FIG. 8 shows a graph 800 illustrating the DI Water Contact Angle on scale 804, as a function of the substrate Temperature on scale 802. Graph 800 shows Curve 810 for a FDTS coating directly vapor deposited on a silicon wafer substrate; Curve 806 for a two-layer $AlO_x$/FDTS on the silicon wafer substrate, where the $AlO_x$ was generated from triethylaluminum precursor and was about 50 Å thick.; Curve 808 for a three-layer coating of $AlO_x$/$TiO_x$/FDTS on the silicon wafer substrate, where the AlOx was generated from triethylaluminum precursor and was about 80 Å thick and the TiOx was generated from $TiCl_4$ precursor and was about 80 Å thick; Curve 812 for a three-layer coating of $AlO_x$/$SiCl_4$-generated $SiO_x$/FDTS, where the triethylaluminum-generated $AlO_x$ layer was about 94 Å thick and the SiOx layer was about 148 Å thick; and, Curve 814 for a three-layer coating of AlO$_x$/BTCSE-generated SiO$_x$/FDTS, where the triethylaluminum-generated AlOx layer was about 100 Å thick and the BTCSE SiOx layer was about 105 Å thick.

The results shown in Graph 800 are particularly unexpected because Curve 810, where the FDTS was vapor deposited directly over the silicon substrate shows that this coating has better temperature stability than both curve 806 for a two layer coating of AlO$_x$/FDTS and curve 808 for a three-layer coating of AlO$_x$/TiO$_x$/FDTS. This comparison also confirms an earlier conclusion that a three-layer coating where two layers of metal-containing inorganic oxide underlie the SAM does not provide the kind of performance observed for a three-layer coating of the kind representative of the present invention. This three-layer coating is at least a three layer coating, where the first layer is a metal-containing inorganic oxide adhesion layer, which may be an oxide of aluminum, zirconium, tin, or titanium (by way of example and not by way of limitation); the second layer is a silicon-comprising layer, which may be silicon oxide, silicon nitride, or silicon oxynitride (by way of example and not by way of limitation); and the third layer is a SAM which may be generated using one of the multitude of precursor materials described previously herein. As previously discussed, the second layer may be replaced by a multiple of layers, where at least one of the layers is the silicon-comprising layer.

Exemplary of the three-layer coating of the present invention are Curve 812 which is a coating of AlO$_x$/SiCl$_4$-generated SiO$_x$/FDTS Curve 812, and Curve 814, which is a coating of AlO$_x$/BTCSE-generated SiO$_x$/FDTS. While the three-layer coating illustrated by Curve 812 provides a significant improvement over the FDTS-generated SAM applied directly to the silicon substrate surface, the three-layer coating illustrated by Curve 814 is far superior to all other coatings, showing temperature stability at temperatures greater than 500° C. By way of a possible theory for this improved performance, it may be that the BTCSE-generated SiO$_x$, after exposure to temperatures at which the organic component would break down, provides a carbon-doped silicon oxide which improves the overall stability of the three-layer structure. This would indicate that other silicon-comprising intermediate layers which are carbon doped silicon oxides are likely to be stable to 500° C.

The unexpected result of a three-layer coating having a temperature stability exceeding 500° C., achieved using an organic silicon-comprising precursor to form an intermediate layer, opens the door to the use of higher processing temperatures for devices while providing a protective coating which resists moisture penetration to a coated substrate.

Figure 6:
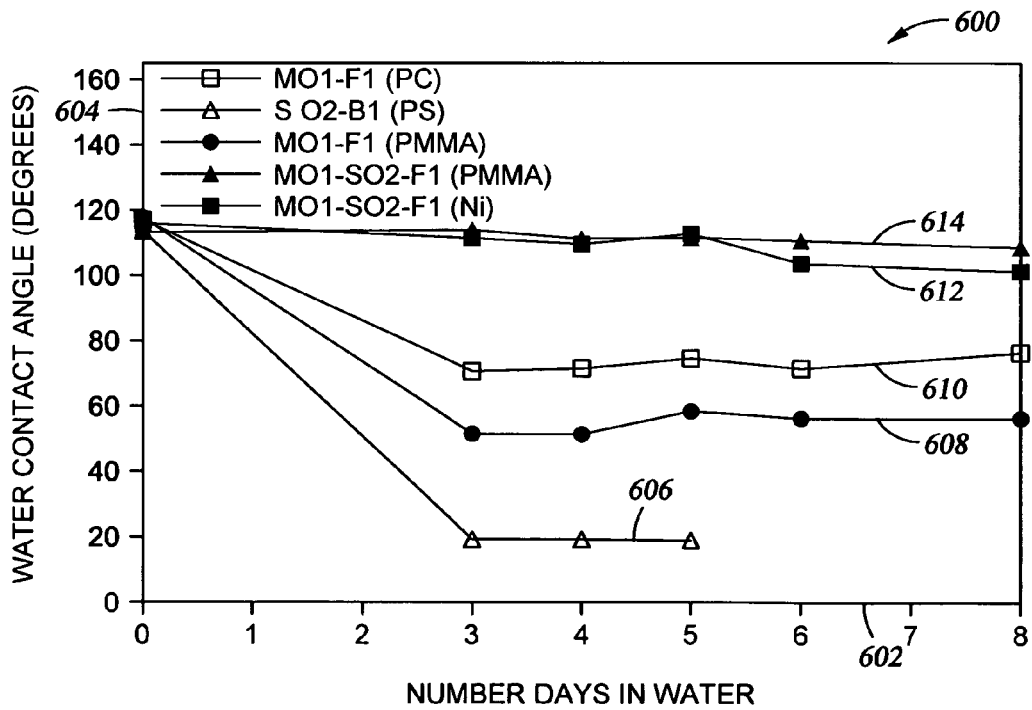
FIG. 6 shows a graph 600 illustrating the DI Water Contact Angle on scale 604, as a function of the Number of Days of Water Immersion on Scale 602, for a two-layer AlOx/FDTS coating deposited on three different substrates, compared with a three-layer AlOx/SiCl$_4$ Ox/FDTS coating on two substrates. The two-layer coating data is provided for purposes of comparison of two-layer coatings of the kind previously used with coatings which are embodiments of the present invention.

In addition to improved temperature stability and durability of the at least three-layer multilayered coatings described above, we have been able to achieve improved resistance to liquid immersion. SAM films are not stable when deposited directly on many materials, especially noble metals and polymers. The use of dual layer coatings where the SAM is applied over an adhesion layer of silicon oxide allows for an improved adhesion on some materials. However, the resistance of the coating to liquid has remained limited. For example, a dual layer of BTCSE-generated SiOx used as an adhesion layer with a FDTS exterior layer, which is otherwise very stable on silicon and metal substrates, quickly loses the hydrophobic surface property and adhesion to polymer substrates upon immersion in water as illustrated in FIG. 6 and described in detail below. Therefore, such two-layer coatings can not be used on polycarbonate, polystyrene, poly methyl methacrylate, or other similar polymeric materials frequently used in micro fluidic applications. The use of ALD metal oxides such as e.g. aluminum oxide as an underlying adhesion layer can improve adhesion of an overlying functional organic coating to polymers and in addition provide a vapor barrier. However, use of the metal oxide adhesion layers alone as a barrier to penetration by liquids does not work well.

We were surprised to find that by using a combination of a metal oxide and silicon-containing oxide beneath the organic functional layers, we were able to obtain a triple-layer structure which exhibits excellent performance at high temperatures, and which exhibits excellent performance as a barrier layer not only with respect to vapors, but even with respect to immersion in liquids. This is despite the fact that the use of either the metal oxide or the silicon-containing oxide alone beneath the organic functional layer does not provide such thermal or liquid immersion performance. For example, plastic devices can be coated with a triple layer film (alumina+a BTCSE-generated silicon oxide+FDTS-generated SAM). This combination of three layers, each serving the respective distinct function provides a unique and surprising solution, a stable hydrophobic film shown in FIG. 6 with respect to a polymethyl methacrylate (PMMA) substrate.

FIG. 6 shows a graph 600 illustrating the DI Water Contact Angle on scale 604, as a function of the Number of Days of DI Water Immersion on Scale 602, for a two-layer AlOx/FDTS coating deposited on three different substrates, compared with a three-layer AlOx/SiCl$_4$ Ox/FDTS coating on two substrates. The two-layer coating data is provided for purposes of comparison of two-layer coatings of the kind previously used with coatings which are embodiments of the present invention.

With respect to FIG. 6, Curve 606 represents the performance of a polystyrene substrate coated with a 38 Å thick SiO$_x$ adhesion layer generated from a BTCSE precursor, with an exterior layer of an FDTS generated SAM. The hydrophobic surface (DI Water Contact Angle of 100 degrees or more) had degraded after less than one day of immersion in DI water. Curve 608 represents the performance of a polymethyl methacrylate substrate coated with a two-layer coating essentially equivalent to that described with reference to Curve 606. The hydrophobic surface degraded below the 100 degree contact angle in about one day. Curve 610 represents the performance of a polystyrene substrate coated with a two-layer coating essentially equivalent to those described with reference to Curves 606 and 608. The hydrophobic surface degraded below the 100 degree contact angle in about one and a quarter days.

The disappointing performance of the two-layer coatings described above is compared with the performance of two embodiment coatings of the present invention in FIG. 6. Curve 612 represents a nickel substrate coated with a three-layer coating of a 53 Å thick alumina adhesion layer generated from a trimethyl aluminum precursor, followed by a second protective/mechanical structural layer of 115 Å thick SiOx generated from a BTCSE precursor, with an exterior layer of FDTS-generated SAM. The degradation of the hydrophobic surface below the 100 degree contact angle appeared imminent, but had not occurred after 8 days of immersion in DI water. Curve 614 represents a polymethyl methacrylate substrate coated with a three-layer coating of a 53 Å thick alumina adhesion layer generated from a trimethyl aluminum precursor, followed by a second protective/mechanical structural layer of 115 Å thick SiOx generated from a BTCSE precursor, with an exterior layer of FDTS-generated SAM. The degradation of the hydrophobic surface below the 100 degree contact angle had not occurred after 8 days of immersion in DI water, and appeared to be extendable for a number of additional days.

Figure 7:
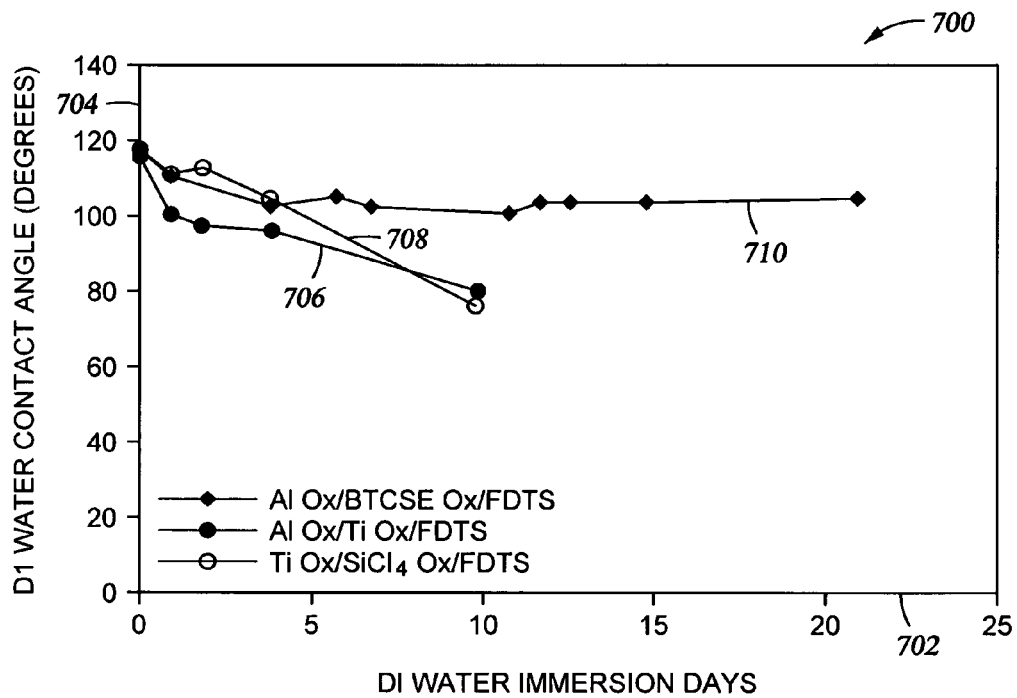
FIG. 7 shows a graph 700 illustrating the DI Water Contact Angle on scale 704, as a function of the number of days immersion in DI Water on scale 702. The three-layer coatings were deposited on a SU8 resist material substrate. Curve 706 represents the change in DI water contact angle for an AlO$_x$/TiO$_x$/FDTS coating. Curve 708 represents the change in DI water contact angle for an AlO$_x$/SiCl$_4$-generated SiO$_x$/FDTS coating. Curve 710 represents the change in DI water contact angle for an AlO$_x$/BTCSE-generated SiOx/FDTS coating.

FIG. 7 shows a Graph 700 illustrating the DI Water Contact Angle on scale 704, as a function of the number of days immersion in DI Water on scale 702. The three-layer coatings which are represented by various curves on Graph 700 were deposited on a NANO™ SU-8 polymer substrate. The SU-8 material was originally used as a negative photoresist, but more recently, the material has been used as a polymeric substrate for semiconductor devices, MEMS devices, and nanoimprint lithography molds. The SU-8 material is an epoxy-based photoresist material available from Micro-Chem of Newton Mass. Curve 706 represents the change in DI water contact angle for an $AlO_x/TiO_x/FDTS$ coating after immersion in DI water. Curve 708 represents the change in DI water contact angle for an $TiO_x/SiCl_4$-generated $SiO_x/FDTS$ coating. Curve 710 represents the change in DI water contact angle for an $AlO_x/BTCSE$-generated SiOx/FDTS coating. The three-layer coating which makes use of an aluminum oxide adhesion layer, followed by an organic-containing silicon precursor to form the intermediate layer, followed by the SAM functional exterior layer shows unexpected long term moisture resistance, having surpassed 20 days of immersion in DI water without loss of the hydrophobic surface characteristics of the functional exterior layer. This is the same kind of three-layer structure which exhibited the best high temperature performance.

The three-layer/multi-layered coatings described above are useful as release layers for Nanoimprint Lithography (NIL). NIL technology uses UV curable resists or thermal resists during pattern replication by mechanical imprint. One of the challenges in NIL is fidelity of pattern replication and an ability to release the mold from the resists without mold contamination. While mold materials such as quartz and silicon with high density of hydroxyl groups can be easily coated with low surface energy fluorocarbon SAM coatings metal molds such as e.g. stainless steel, nickel, or other metal alloys are difficult to coat due to poor adhesion of the coatings to the substrate and low resistance of the coatings to mechanical and thermal stresses during the imprinting process.

We have experimented with using various protective film combinations on NIL nickel molds and stamps. The results are summarized in Table Two below.

TABLE TWO

Summary of Imprint Results Using A Ni mold With Various Release Layer Coatings.

| Release Film | Stiction to Resist | Pattern Fidelity | Contamination |
|---|---|---|---|
| None | X | X | X |
| FDTS(SAM) | X | Δ | X |
| BTCSE $SiO_x$/FDTS(SAM) | Δ | Δ | Δ |
| $AlO_x$/FDTS(SAM) | Δ | O | Δ |
| $AlO_x$/BTCSE $SiO_x$/ FDTS(SAM) | O | O | O |

X = bad, failure due to stiction;
Δ = good for a limited number (<5) of imprints;
O = good and reproducible during multiple (>10) imprint events.

Not surprisingly the $AlO_x$/BTCSE $SiO_x$/FDTS(SAM) three-layer coating combination resulted in the best release layer, as this triple-layer coating had been shown to deliver the best high temperature and liquid immersion stability, indicative of good interlayer adhesion in-between the layers and with the Ni substrate.

Ink-jet Protective Layers are another product application for the coatings of the present invention. Polyimide (PI) is frequently used for device protection but its contact angle of about 70 deg. is to low to prevent ink spreading and smearing. A hydrophobic layer with good adhesion to PI and compatible with water and other ink solvents is very desirable. Polyimide material such as that used for ink-jet heads was coated with the $AlO_x$/BTCSE $SiO_x$/FDTS(SAM) three-layer film stack. The sample was then soaked in water based ink at 70° C. for 2 hrs. Good adhesion and hydrophobic contact angle were preserved as indicated by ink de-wetting times of <5 sec. By comparison the dual-layer BTCSE $SiO_x$/FDTS(SAM) film completely lost adhesion to the polyimide substrate under these conditions, and can not be used for this application.

In biotechnology applications, the exterior functional layer of the at least three layer coating of the present invention needs to be compatible with biological tissue, for example. It is also possible to provide an improved three-layer hydrophilic film which comprises a metal oxide adhesion layer of the kind described above deposited in the manner described, followed by a silicon oxide-comprising layer where the silicon oxide is formed from a carbon-containing precursor such as the Bis(trichlorosilyl)ethane (BTCSE), followed by a hydrophilic functional layer such as polyethylene glycol (PEG) applied over the silicon oxide-comprising layer. The BTCSE-generated silicon oxide-comprising layer, or a similar layer formed from an organic silicon-comprising precursor material tends to maintain its contact angle with a water droplet for an extended period of time, compared with a silicon-oxide layer prepared using a non-carbon-containing precursor.

The above described exemplary embodiments are not intended to limit the scope of the present invention, as one skilled in the art can, in view of the present disclosure expand such embodiments to correspond with the subject matter of the invention claimed below.

We claim:

1. A method of providing a durable protective coating structure which comprises at least three layers, said method comprising:
    vapor depositing a first layer deposited on a substrate, wherein said first layer is a metal oxide adhesion layer selected from the group consisting of an oxide of a Group IIIA metal element, a Group IVB metal element, a Group VB metal element, and combinations thereof;
    vapor depositing a second layer upon said first layer, wherein said second layer includes a silicon-containing layer selected from the group consisting of silicon oxide, silicon nitride, and silicon oxynitride; and
    vapor depositing a third layer upon said second layer, wherein said third layer is a functional organic-comprising layer, wherein said functional organic-comprising layer is a SAM.

2. A method in accordance with claim 1, wherein said protective coating structure is stable at temperatures of 400° C. and higher.

3. A method in accordance with claim 1, wherein said second layer includes a layer of silicon-comprising oxide generated from an inorganic precursor.

4. A method in accordance with claim 1, wherein said second layer includes a layer of silicon-comprising oxide generated from an organic precursor.

5. A method in accordance with claim 1, wherein said coating is a three-layer coating, and said second layer is a silicon-comprising layer.

6. A method in accordance with claim 5, wherein said first layer metal oxide is deposited using an ALD technique.

7. A method in accordance with claim 6, wherein said precursor materials used during said ALD process include an organometallic compound.

8. A method in accordance with claim 5, wherein said second layer is a silicon-comprising oxide which is deposited using a CVD technique.

9. A method in accordance with claim 8, wherein said CVD technique is an MVD technique.

10. A method in accordance with claim 5, wherein said third layer is a functional organic layer which is deposited using a CVD technique.

11. A method in accordance with claim 10, wherein said CVD technique employs a stagnation reaction.

12. A method in accordance with claim 1, wherein said first layer metal oxide is deposited using an ALD technique.

13. A method in accordance with claim 12, wherein said second layer is a silicon-comprising oxide which is deposited using a CVD technique.

14. A method in accordance with claim 13, wherein said CVD technique employs a stagnation reaction.

15. A method in accordance with claim 14, wherein said third layer is a functional organic layer which is deposited using said CVD technique.

16. A method in claim 12, wherein said third layer is a functional organic layer which is deposited using a CVD technique.

17. A method in accordance with claim 16, wherein said CVD technique employs a stagnation reaction.

18. A method in accordance with claim 12, wherein said third layer is a functional organic layer which is deposited using a CVD technique, said CVD technique employs a stagnation reaction.

19. A method in accordance with claim 12, wherein said precursor materials used during said ALD process include an organometallic compound.

20. A method in accordance with claim 1, wherein said second layer includes a metal oxide and a silicon-comprising oxide.

21. A method in accordance with claim 1, or claim 3, or claim 4, wherein said at least three layers are deposited in the same processing chamber without exposing the surface of said first layer or the surface of said second layer to ambient conditions.

22. A method in accordance with claim 1,
wherein said first layer is an aluminum oxide layer; and
wherein said second layer is a silicon oxide layer.

23. A method in accordance with claim 1,
wherein said first layer is a titanium oxide layer; and
wherein said second layer is a silicon oxide layer.

24. A method of providing a durable protective coating structure which comprises at least three layers, said method comprising:
vapor depositing a first layer deposited on a substrate, wherein said first layer is a metal oxide adhesion layer selected from the group consisting of an oxide of a Group IIIA metal element, a Group IVB metal element, a Group VB metal element, and combinations thereof;
vapor depositing a second layer upon said first layer, wherein said second layer includes a silicon-containing oxide layer deposited from an organosilane precursor having at least one silicon-carbon bond; and
vapor depositing a third layer upon said second layer, wherein said third layer is a functional organic-comprising layer, wherein said functional organic-comprising layer is a SAM.

* * * * *